United States Patent [19]
Azuma et al.

[11] Patent Number: 5,976,328
[45] Date of Patent: Nov. 2, 1999

[54] PATTERN FORMING METHOD USING CHARGED PARTICLE BEAM PROCESS AND CHARGED PARTICLE BEAM PROCESSING SYSTEM

[75] Inventors: Junzou Azuma, Ebina; Akira Shimase, Yokosuka; Yuichi Hamamura, Yokohama; Hidemi Koike, Hitachinaka, all of Japan

[73] Assignee: Hitachi, Ltd., Tokyo, Japan

[21] Appl. No.: 08/788,421

[22] Filed: Jan. 27, 1997

[30] Foreign Application Priority Data

Jan. 26, 1996 [JP] Japan .................................. 8-011340

[51] Int. Cl.⁶ .................................................. C23C 14/34
[52] U.S. Cl. .............................. 204/192.34; 204/192.11; 204/298.04; 204/298.36; 250/492.3; 156/345; 216/62; 216/66
[58] Field of Search ................. 204/192.11, 192.34, 204/298.04, 298.36; 250/492.3; 216/62, 66; 156/345, 345 B, 345 P, 345 PH, 345 MW, 345 MC

[56] References Cited

U.S. PATENT DOCUMENTS

| | | | |
|---|---|---|---|
| 3,410,774 | 11/1968 | Barson et al. | 204/192 |
| 4,639,301 | 1/1987 | Doherty et al. | 204/192.31 |
| 4,950,498 | 8/1990 | Kaito | 427/38 |
| 4,976,843 | 12/1990 | Ward et al. | 204/298.36 |
| 5,064,520 | 11/1991 | Miyake et al. | 204/192.11 |

FOREIGN PATENT DOCUMENTS

| | | | |
|---|---|---|---|
| 61-79230 | 4/1986 | Japan | H01L 21/302 |
| 61-133316 | 6/1986 | Japan | C21D 9/00 |
| 61-160939 | 7/1986 | Japan | H01L 21/302 |
| 62-86731 | 4/1987 | Japan | H01L 21/302 |
| 1-169860 | 7/1989 | Japan | H01J 37/244 |
| 2-135732 | 5/1990 | Japan | H01L 21/302 |
| 3-225820 | 10/1991 | Japan | H01L 21/28 |
| 4-75246 | 3/1992 | Japan | H01J 37/31 |

*Primary Examiner*—Alan Diamond
*Assistant Examiner*—Steven H. Ver Steeg
*Attorney, Agent, or Firm*—Antonelli, Terry, Stout & Kraus, LLP

[57] ABSTRACT

A pattern forming method using an improved charged particle beam process, and a charged particle beam processing system prevent effectively the corrosion of a workpiece by a reactive gas adsorbed by and adhering to the surface of the workpiece when the workpiece is taken out into the atmosphere after pattern formation. The charged particle beam processing system comprises, as principal components, an ion beam chamber provided with an ion beam optical system, a processing chamber (18) provided with a gas nozzle through which a reactive gas is blown against a workpiece, a load-lock chamber connected through a gate valve to the processing chamber. The load-lock chamber is capable of producing a plasma of an inert gas for processing the surface of the workpiece by sputtering. The workpiece is returned to the load-lock chamber after a pattern has been formed thereon in the processing chamber by reactive processing including irradiating the surface of the workpiece with a charged particle beam in an environment of the reactive gas, and the workpiece is subjected to a plasma process to remove the reactive gas adsorbed by the workpiece during pattern formation and adhering to the workpiece.

7 Claims, 5 Drawing Sheets

PATTERN FORMING METHOD USING CHARGED PARTICLE BEAM PROCESS AND CHARGED PARTICLE BEAM PROCESSING SYSTEM

BACKGROUND OF THE INVENTION

The present invention relates to a pattern forming method using a charged particle beam process, and a charged particle beam processing system and, more specifically, to a pattern forming method using a charged particle beam process and suitable for preventing the corrosion of a workpiece by a reactive gas when minutely processing the workpiece by using a charged particle beam and the reactive gas, and improvements in a charged particle beam processing system.

A charged particle beam, such as a focused ion beam or an electron beam, can be focused in a beam of a very small diameter. Fine processing of wiring patterns of semiconductor devices, such as LSI circuit devices, for the correction of the wiring patterns of semiconductor devices and the analysis of defects in semiconductor devices can be achieved by using the energy of a charged particle beam. Since fine processing using a charged particle beam is a sputtering process in which atoms or groups of atoms of the materials of the workpiece are caused to sputter by the impingement of the charged particle beam on the surface of the workpiece, the processing speed of the fine processing is relatively low, the selectivity of the fine processing in terms of the material of the sample, i.e., a workpiece, is relatively low, and it is very difficult to stop processing at a desired layer in a workpiece of a laminated structure having a plurality of layers of different materials.

Active studies have been made in recent years on processing techniques using a reactive gas and a charged particle beam, such as a focused ion beam or an electron beam, in combination. These processing techniques activates a reactive gas by the energy of a charged particle beam to induce a chemical reaction. Therefore, these processing techniques enables the rapid etching of a workpiece, and is capable of stopping processing at a desired layer of a material in a laminated structure by selectively using a reactive gas suitable for processing the layers of different materials of the workpiece.

A technique relating to a processing system using such a processing method is disclosed in JP-A No. 1-169860.

Although a pattern forming method (process) using, in combination, a reactive gas and a charged particle beam is capable of rapid processing, some reactive gases are highly corrosive to metals. For example, if chlorine gas ($Cl_2$ gas) is employed as a reactive gas in processing a workpiece made of aluminum (Al), $Cl_2$ gas adsorbed by the workpiece remains on the surface of the workpiece even if the supply of $Cl_2$ gas is stopped. Therefore, the $Cl_2$ gas retained on the surface of the workpiece by adsorption reacts with moisture contained in the atmosphere when the workpiece carrying the $Cl_2$ gas is taken into the atmosphere, corrodes the Al workpiece and damages processed portions of the Al workpiece.

Nothing about the processing of the reactive gas adsorbed by the workpiece is considered by the prior art.

SUMMARY OF THE INVENTION

Accordingly, it is an object of the present invention to solve problems in the foregoing prior art and to provide a pattern forming method employing improved charged particle beam processing and a charged particle beam processing system capable of preventing the corrosion of a workpiece by a reactive gas retained on the surface thereof by adsorption when the workpiece is taken out from the processing chamber into the atmosphere.

The foregoing object can be achieved by a method (a) which forms a desired pattern in a processing chamber by etching a layer formed on a workpiece by a reactive process using, in combination, a reactive gas and a charged particle beam, and subjects the surface of the workpiece to a plasma sputter processing using a plasma of an inert gas before taking out the workpiece from the processing chamber into the atmosphere, a method (b) which heats a workpiece by a heating device, such as a heater or a lamp, a method (c) which coats the surface of a workpiece with a carbon film before subjecting the workpiece to a reactive pattern forming process, and removes the carbon film remaining on the surface of the workpiece by oxygen plasma ashing, a method (d) which forms a pattern by irradiating a workpiece with a charged particle beam while oxygen gas is blown against the surface of the workpiece in the atmosphere of a reactive gas or a method (e) which forms a pattern on a workpiece by irradiating the workpiece with both an oxygen beam and a charged particle beam.

The method (a) processes the workpiece by a plasma of an inert gas before taking out the workpiece from the processing chamber into the atmosphere by a plasma processing method which supplies an inert gas, such as Ar gas or $N_2$ gas, at a flow rate of 10 sccm, maintains the pressure in a processing chamber at 133 Pa, exerts power of 200 W and 13.56 MHz on the inert gas to produce the plasma, and exposes the surface of the workpiece to the plasma for 3 to 5 min for light plasma sputter processing. The plasma is produced by high-frequency discharge or microwave discharge.

In this method, which subjects the workpiece to plasma sputter processing using the plasma of the inert gas before taking out the workpiece from the processing chamber into the atmosphere, the following reactions take place when the workpiece is exposed to the plasma.

(1) The workpiece is heated and, consequently, the reactive gas adsorbed by and adhering to the surface of the workpiece is forced to separate from the workpiece by heat.

(2) The reactive gas adsorbed by and adhering to the surface of the workpiece is forced to separate from the workpiece by the impact applied thereto by the plasma.

(3) The material forming the workpiece is oxidized and the chemical resistance of the workpiece against the reactive gas is enhanced.

These reactions purge the surface of the workpiece of the reactive gas adhering thereto and hence the workpiece will not be corroded when taken out from the processing chamber into the atmosphere.

The method (b) heats the workpiece at a temperature that purges the surface of the workpiece of the reactive gas adhering thereto and, consequently, the workpiece will not be corroded when taken out from the processing chamber into the atmosphere. The method (b) heats the workpiece in an evacuated environment maintained at a vacuum on the order of 1 to $5 \times 10^{-4}$ Pa by a heating means, such as a heating device to purge the surface of the workpiece of the reactive gas, such as $Cl_2$ gas, adhering thereto. Practically, it is preferable that the workpiece is heated at a temperature in the range of, for example, 150 to 250° C. The workpiece may be heated in an environment of an inert gas, such as $N_2$ gas, instead of in an evacuated environment for the same effect.

The method (c) coats the surface of the workpiece with a carbon film and hence the reactive gas is adsorbed by the carbon film. Therefore, portions of the material of the workpiece other than those irradiated with the charged particle beam do not react on the reactive gas, and the workpiece can perfectly be purged of the reactive gas by removing the carbon film by an oxygen plasma ashing process subsequent to the reactive gas process. The carbon film may be formed so as to cover regions in the surface of the workpiece other than those in which a pattern is formed. Practically, the thickness of the carbon film is several hundreds angstroms. It is desirable to form the carbon film in the least necessary thickness.

Although the carbon film can be formed by a sputtering process, it is practically preferable to form the carbon film by a plasma CVD process because a pattern forming system is suitable for the plasma CVD process. Although residual portions of the carbon film remaining on the workpiece after a pattern has been formed may be left unremoved if the purpose of application permits, usually, it is desirable to produce an oxygen plasma and to burn and evaporate the carbon film by exposing the workpiece to the oxygen plasma (oxygen plasma ashing). The reactive gas adhering to the carbon film is removed together with the carbon film from the workpiece.

The method (d), which irradiates the workpiece with a charged particle beam while oxygen gas is blown against the surface of the workpiece, and the method (e), which irradiates the workpiece with an oxygen beam, oxidize the surface of the workpiece by the agency of the oxygen gas and remove the reactive gas adhering to the surface of the workpiece by the impact given thereto by the charged particle beam. Therefore, the workpiece will not be corroded when taken out from the processing chamber into the atmosphere.

DESCRIPTION OF THE PREFERRED EMBODIMENTS

Preferred embodiments of the present invention will be described hereinafter with reference to the accompanying drawings.

First Embodiment

A charged particle beam processing system in a first embodiment according to the present invention and a pattern forming method to be carried out by the same charged particle beam processing system will be described with reference to FIG. 1.

(1) Charged Particle Beam Processing System

An ion beam and an electron beam, as charged particle beams, are substantially the same in processing effects. In the following description, the charged particle beam is supposed to be a focused ion beam by way of example.

Figure 1:
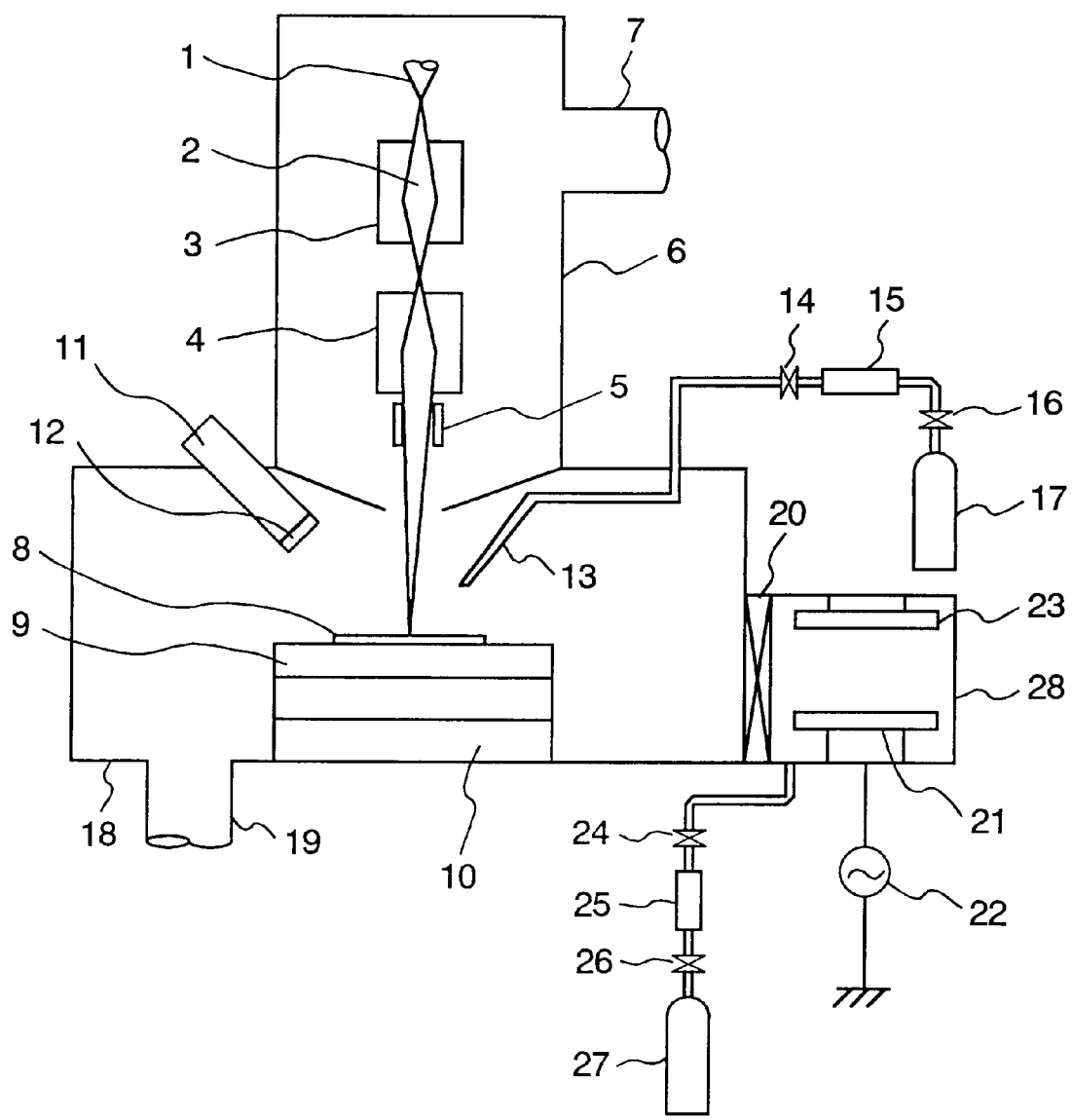
FIG. 1 is a schematic sectional view of a charged particle beam processing system in a first embodiment according to the present invention.

Referring to FIG. 1, an ion beam optical system is disposed in an ion beam chamber 6 formed in an ion beam vessel. The ion beam optical system comprises an ion source 1 (Ga in this embodiment), lenses 3 and 4 for focusing an ion beam 2 emitted by the ion source 1, and a deflector 5 for deflecting the ion beam 2. The components of the ion beam optical system are controlled by a power source and a controller, not shown.

An evacuating device, not shown is connected by a discharge pipe 7 to the ion beam chamber 6 to evacuate the ion beam chamber 6 at a vacuum. A through hole is formed in a bottom wall of the ion beam vessel defining the ion beam chamber 6 so that the ion beam 2 is able to travel through the through hole and the flow of a reactive gas into the ion beam chamber 6 is limited to the least possible extent.

A main vessel defining a processing chamber 18 is joined to the bottom of the ion beam vessel defining the ion beam chamber 6. Disposed in the processing chamber 18 are a workpiece holder 9 on which a workpiece 8 is mounted, an X-Y stage 10 capable of moving along the X- and the Y-axis, a gas nozzle 13 for blowing a reactive gas against the workpiece 8, and a secondary particle detector having, for example, a photomultiplier 11 and a scintillator 12 in combination. The processing chamber 18 is evacuated to a vacuum through a discharge pipe 19 by an evacuating device, not shown.

A signal provided by the secondary particle detector comprising the photomultiplier 11 and the scintillator 12 by amplifying a signal provided upon the detection of secondary particles is processed by an amplifier and a signal processing circuit, not shown, synchronizing with a deflecting signal for deflecting the ion beam 2 to form an image of secondary particles on the surface of the workpiece 8 for the observation of a surface being processed.

The gas nozzle 13 is connected through valves 14 and 16, and a flow regulator 15 to a gas cylinder 17 containing a reactive gas.

A load-lock chamber 28 is connected through a gate valve 20 to the processing chamber 18. The holder 9 is carried into the load-lock chamber 28 by a conveying system, not shown. Disposed within the load-lock chamber 28 are a lower electrode 21 for supporting the holder 9, connected to a HF power source (high-frequency power source) 22, and an upper electrode 23 disposed opposite to the lower electrode 21 and connected to a ground. A predetermined inert gas is supplied from an inert gas cylinder 27 through valves 24 and 26, and a flow regulator 25 into the load-lock chamber 28. The load-lock chamber 28 serves as a plasma sputter processing chamber in which the workpiece 8 is sputter processed by a plasma of the inert gas.

(2) Pattern Forming Method Using the Charged Particle Beam Processing System

A pattern forming method including a charged particle beam process to be executed by the charged particle beam processing system shown in FIG. 1 will specifically be described hereinafter.

In the following description, it is supposed that the workplace 8 is a silicon wafer having a surface coated with an Al thin film, the reactive gas is $Cl_2$ gas, the inert gas is Ar gas, and the Al thin film is processed in a predetermined pattern by a charged particle beam process.

The workpiece holder 9 holding the workpiece 8 is placed in the load-lock chamber 28, the load-lock chamber 28 is evacuated to a vacuum by the evacuating device, not shown, and then the gate valve 20 is opened to transfer the workpiece holder 9 from the load-lock chamber 28 onto the X-Y stage 10 disposed in the processing chamber 18. Then, the ion source 1 projects the ion beam 2, the lenses 3 and 4 focus the ion beam 2, and the deflector 5 deflects the focused ion beam 2 to scan the surface of the workpiece 8 with the focused ion beam 2.

Positions and regions on the surface of the workpiece 8 to be processed are determined through the observation of an image of the surface of the workpiece 8 formed by amplifying detection signals provided through the detection of secondary electrons discharged from the surface of the workpiece 8 by the secondary particle detector comprising the photomultiplier 11 and the scintillator 12. Then, the valves 14 and 15 are opened to supply $Cl_2$ gas, i.e., the reactive gas, from the reactive gas cylinder 17 at a predetermined flow rate regulated by the flow regulator 15 to the gas nozzle 13. $Cl_2$ gas is blown through the gas nozzle 13 against the surface of the workpiece 8.

While $Cl_2$ gas is being blown through the gas nozzle 13 against the surface of the workpiece 8, the predetermined regions on the surface of the workpiece 8 are scanned with the ion beam 2 for reactive processing to form a desired pattern. After the desired pattern has been formed by reactive processing, the radiation of the ion beam 2 is stopped, the valves 14 and 16 are closed to stop supplying $Cl_2$ gas.

Subsequently, the gate valve 20 is opened, the holder 9 is transferred from the processing chamber 18 through the gate valve 20 onto the lower electrode 21 disposed within the load-lock chamber 28. Then, the gate valve 20 is closed to isolate the load-lock chamber 28 from the processing chamber 18, the valves 24 and 26 are opened to supply Ar gas, i.e., the inert gas, at a flow rate of several tens standard cubic centimeters per minute regulated by the flow regulator 25 from the inert gas cylinder 27 into the load-lock chamber 28.

Upon the stabilization of the flow rate of Ar gas and the pressure in the load-lock chamber 28, the HF power source 22 applies a HF voltage (high-frequency voltage) to the lower electrode 21. Consequently, an Ar plasma is produced in a space between the holder 9 and the upper electrode 23, and the surface of the work piece 8 is bombarded with $Ar^+$ ions, whereby the surface of the workpiece 8 is purged of $Cl_2$ gas adhering thereto by the impact of $Ar^+$ ions.

At the same time, the workpiece 8 exposed to the plasma is heated, and the heat generated in the workpiece 8 promotes the separation of $Cl_2$ gas from the workpiece 8. After thus purging the surface of the workpiece 8 of $Cl_2$ gas adhering thereto for a predetermined time, the application of the HF voltage by the HF power source 22 to the lower electrode 21 is stopped to stop the ionization of Ar gas, the valves 24 and 26 are closed to stop supplying Ar gas into the load-lock chamber 28. Then, the workpiece 8 is taken out from the load-lock chamber into the atmosphere. The reaction of $Cl_2$ gas with moisture contained in the atmosphere, which may occur unless the workpiece 8 is purged of $Cl_2$ adhering thereto, does not occur and hence the workpiece 8 is not corroded.

Although the first embodiment employs the HF power source as a means for producing the plasma, a discharge means employing a microwave may be used for the same purpose and the same effect.

The reactive gas may be a halogen gas corrosive to metals other than $Cl_2$ gas, such as $Br_2$ gas, $I_2$ gas or $F_2$ gas, and the inert gas may be $N_2$ gas instead of Ar gas. A plasma produced by ionizing oxygen gas may be used for the plasma process.

In the first embodiment, the surface of the workpiece 8 is subjected to a plasma cleaning process using the etching action of an Ar gas plasma in the load-lock chamber 28 to remove moisture and such adhering to the surface before feeding the workpiece 8 into the processing chamber 18. Then the workpiece thus cleaned is subjected to a reactive process for forming a pattern in the processing chamber 18. Since the surface of the workpiece 8 is cleaned and impurities including moisture are removed from the surface of the workpiece 8 before the workpiece 8 is subjected to the reactive process, the corrosion of the surface of the workpiece 8 by the reaction of the reactive gas blown against the surface of the workpiece 8 with moisture which may otherwise be remaining on the surface of the workpiece 8 does not occur.

Second Embodiment

A charged particle beam processing system in a second embodiment according to the present invention and a pattern forming method to be carried out by the same charged particle beam processing system will be described with reference to FIG. 2.

(1) Charged Particle Beam Processing System

Figure 2:
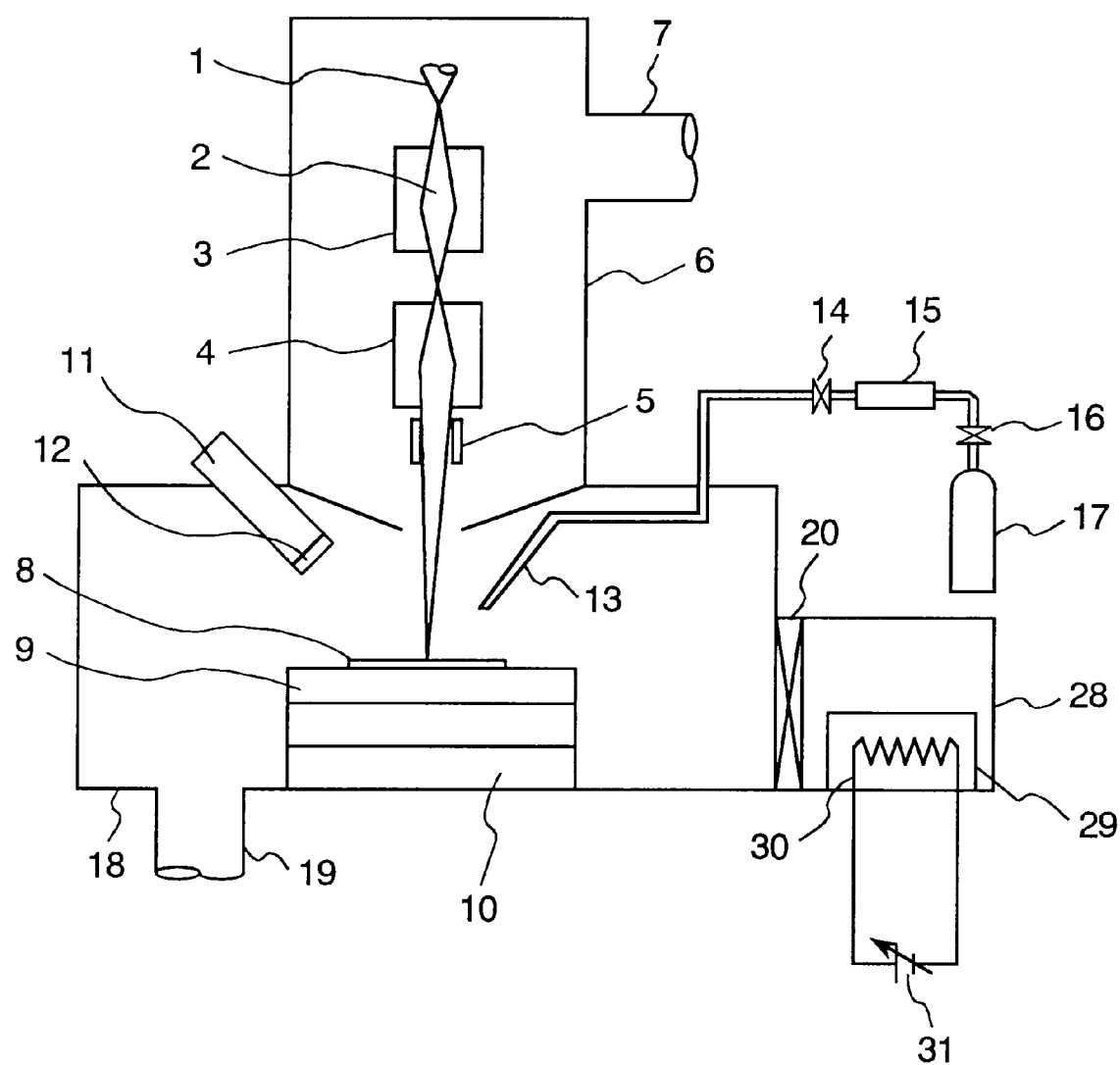
FIG. 2 is a schematic sectional view of a charged particle beam processing system in a second embodiment according to the present invention.

The charged particle beam processing system in the second embodiment shown in FIG. 2 is provided with a load-lock chamber 28 different in construction from that of the first embodiment and is substantially the same in other respects as the charged particle beam processing system in the first embodiment. A holder support 29 for supporting a workpiece holder 9 is disposed in the load-lock chamber 28, a heater 30 is incorporated into the holder support 29, and the heater 30 is connected to a heater power source 31. The heater power source 31 supplies power to the heater 30 to heat a workpiece 8 held on the workpiece holder 9.

(2) Pattern Forming Method Using the Charged Particle Beam Processing System

Similarly to the pattern forming method using the charged particle beam processing system in the first embodiment, the pattern forming method using the charged particle beam processing system in the second embodiment places the workpiece 8 in a processing chamber 18, and irradiates desired positions and desired regions in the surface of the workplace 8 with an ion beam 2 while $Cl_2$ gas, i.e., a reactive gas, supplied from a reactive gas cylinder 17 is being blown against the surface of the workpiece 8 placed in the processing chamber 18 for reactive processing to form a desired pattern. After the desired pattern has been formed, the workpiece holder 9 holding the workpiece 8 is transferred through a gate valve 20 into the load-lock chamber 28 and is mounted on the holder support 29.

The load-lock chamber 28 is evacuated by an evacuating device, not shown, and is maintained at a vacuum on the order of $1 \times 10^{-4}$ Pa, the heater power source 31 is connected to the heater 30 to heat the workpiece 8 at a temperature in the range of, for example, 150 to 250° C. As the workpiece 8 is heated, $Cl_2$ gas adhering to the surface of the workpiece 8 is forced to separate from the surface of the workpiece 8 by heat. Therefore, workpiece 8 taken out from the load-lock chamber 28 into the atmosphere does not carry any $Cl_2$ gas and hence the workpiece 8 is not corroded by the reaction of $Cl_2$ gas with moisture contained in the atmosphere.

The workpiece 8 may be heated for the same effect in an environment of an inert gas, such as $N_2$ gas, instead of in a vacuum environment.

Third Embodiment

A charged particle beam processing system in a third embodiment according to the present invention and a pattern forming method to be carried out by the same charged particle beam processing system will be described with reference to FIG. 3.

(1) Charged Particle Beam Processing System

Figure 3:
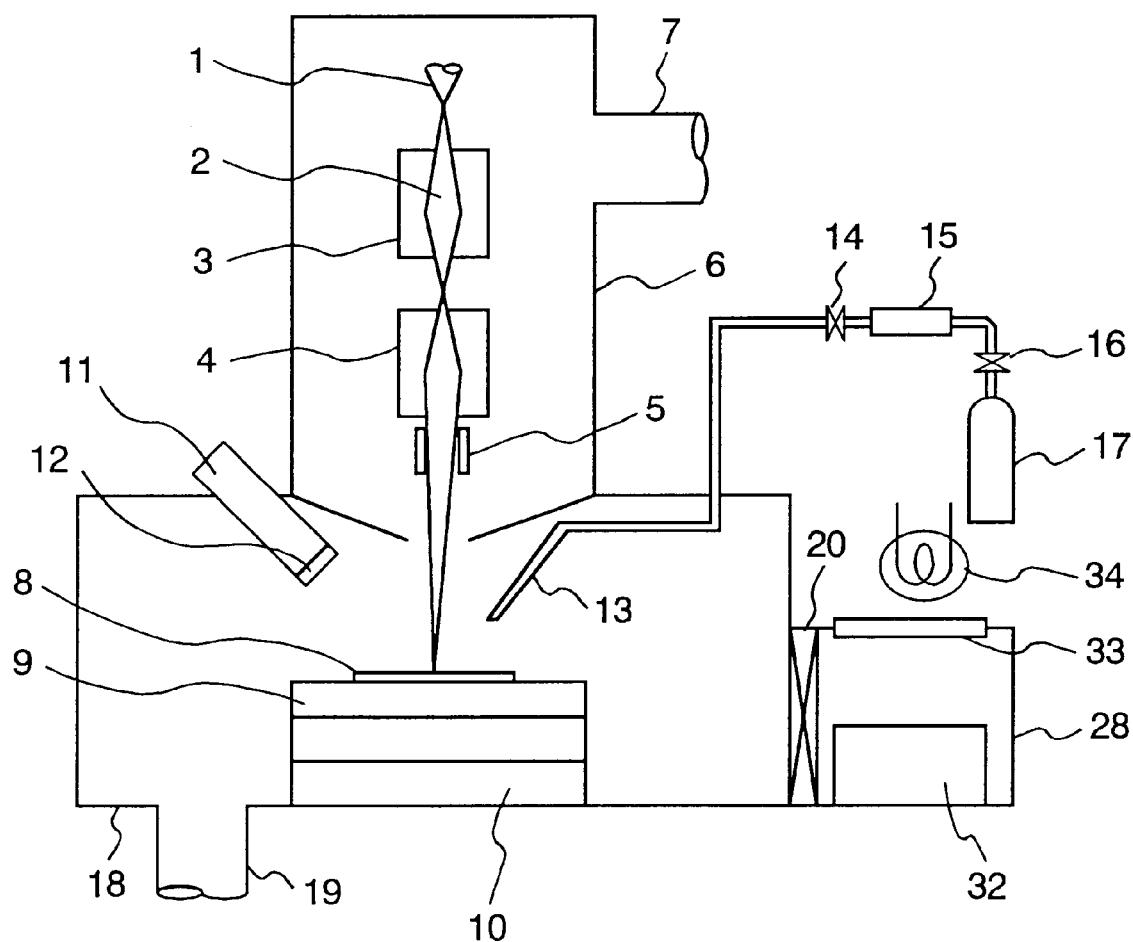
FIG. 3 is a schematic sectional view of a charged particle beam processing system in a third embodiment according to the present invention.

The charged particle beam processing system in the third embodiment shown in FIG. 3 is provided with a load-lock chamber 28 different in construction from that of the first embodiment and is substantially the same in other respects as the charged particle beam processing system in the first embodiment. A holder support 32 for supporting a workpiece holder 9 holding a workpiece 8 is disposed in the load-lock chamber 28, and an opening is formed in an upper wall of a vessel defining the load-lock chamber 28 and is covered with a quartz plate 33. The workpiece 8 held on the workpiece holder 9 mounted on the holder support 32 is heated through the quartz plate 33 by a mercury vapor lamp 34 disposed above the holder support 32. Thus, the third embodiment employs the mercury vapor lamp 34 instead of the heater 30 employed in the second embodiment.

(2) Pattern Forming Method Using the Charged Particle Beam Processing System

Similarly to the pattern forming method using the charged particle beam processing system in the first embodiment, the pattern forming method using the charged particle beam processing system in the third embodiment places the workpiece 8 in a processing chamber 18, and irradiates desired positions and desired regions in the surface of the workplace 8 with an ion beam 2 while $Cl_2$ gas supplied from a reactive gas cylinder 17 is being blown against the surface of the workpiece 8 placed in the processing chamber 18 for reactive processing to form a desired pattern. After the desired pattern has been formed, the workpiece holder 9 holding the workpiece 8 is transferred through a gate valve 20 into the load-lock chamber 28 and is mounted on the holder support 29.

The load-lock chamber 28 is evacuated by an evacuating device, not shown, and is maintained at a vacuum on the order of $1 \times 10^{-4}$ Pa, and then the mercury vapor lamp 34 is turned on.

The workpiece 8 absorbs light emitted by the mercury vapor lamp 34 and generates heat. $Cl_2$ gas adhering to the surface of the workpiece 8 is forced to separate from the surface of the workpiece 8 by the thermal energy. The separation of $Cl_2$ gas from the surface of the workpiece 8 is promoted by light energy. Therefore, workpiece 8 taken out from the load-lock chamber 28 into the atmosphere does not carry any $Cl_2$ gas and hence the workpiece 8 is not corroded by the reaction of $Cl_2$ gas with moisture contained in the atmosphere.

The workpiece 8 may be heated for the same effect in an environment of an inert gas, such as $N_2$ gas, instead of in a vacuum environment.

An infrared lamp may be employed instead of the mercury vapor lamp 34 for heating the workpiece 8 for the same effect.

Although the workpiece 8 is heated in the load-lock chamber in the second and the third embodiment, the processing chamber 18 may be provided with a heating means like that employed in the second or the third embodiment to heat the workpiece 8 for the same purpose and the same effect.

Fourth Embodiment

A charged particle beam processing system in a fourth embodiment according to the present invention and a pattern forming method to be carried out by the same charged particle beam processing system will be described with reference to FIG. 4.

(1) Charged Particle Beam Processing System

Figure 4:
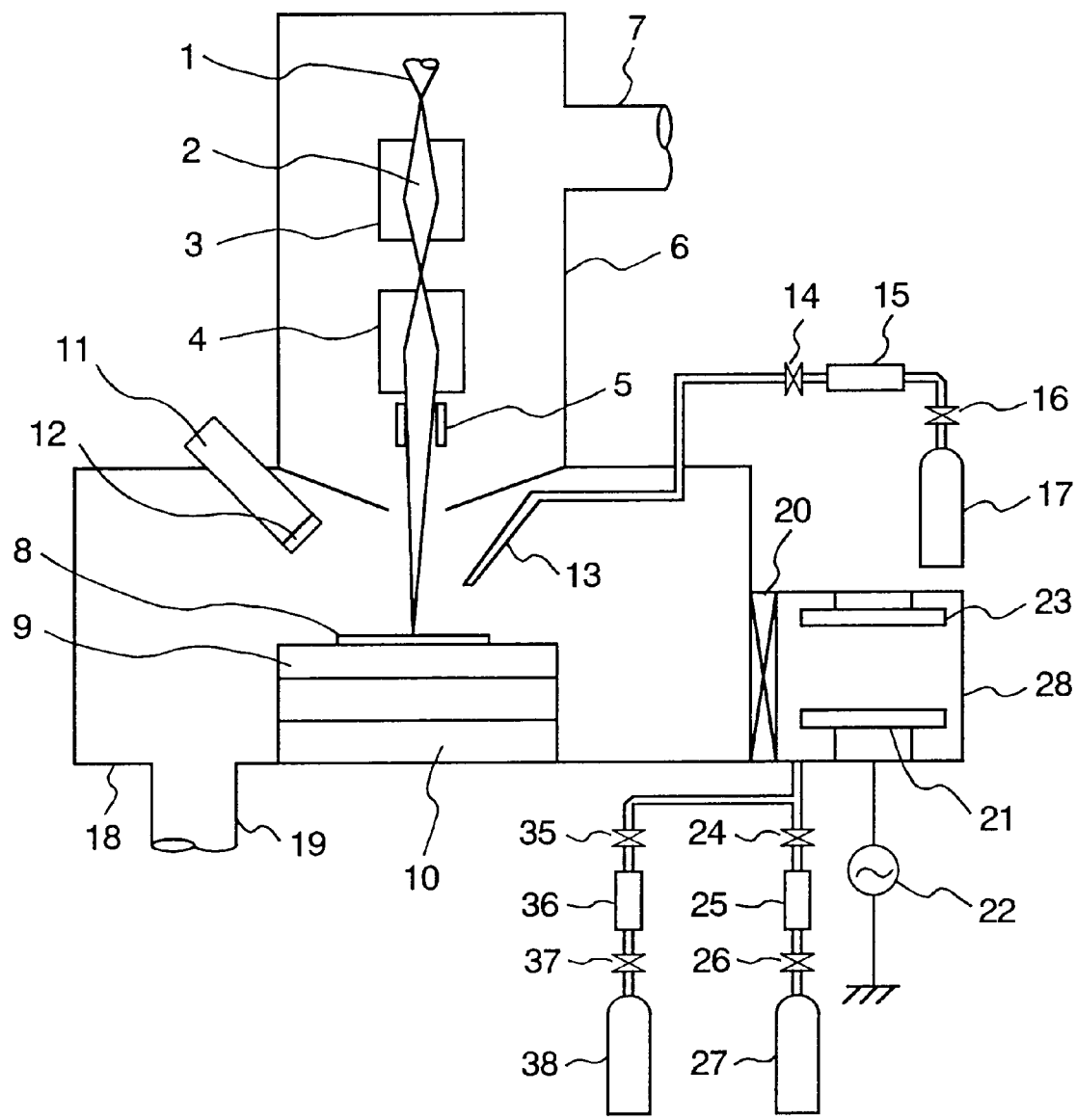
FIG. 4 is a schematic sectional view of a charged particle beam processing system in a fourth embodiment according to the present invention.

As shown in FIG. 4, the charged particle beam processing system in the fourth embodiment is provided with a load-lock chamber 28 the same in construction as that of the first embodiment shown in FIG. 1. The charged particle beam processing system in the fourth embodiment is the same in construction as that in the first embodiment except that a cylinder 27 corresponding to the inert gas cylinder 27 of the first embodiment contains oxygen gas, and a methane gas cylinder 38 is connected through valves 35 and 37 and a flow regulator 36 is connected to a load-lock chamber 28 in the fourth embodiment. The fourth embodiment is the same in other respects as the first embodiment.

(2) Pattern Forming Method Using the Charged Particle Beam Processing System

A workpiece holder 9 holding a workpiece 8 is mounted on a lower electrode 21 disposed in the load-lock chamber 28. The load-lock chamber 28 is evacuated by an evacuating device, not shown, to a vacuum and the load-lock chamber 28 is maintained at the vacuum.

Then, the valves 35 and 37 are opened to supply methane gas at a flow rate of several tens standard cubic centimeters per minute regulated by the flow regulator 36 from the methane gas cylinder 38 into the load-lock chamber 28. Upon the stabilization of the flow rate of methane gas and the pressure in the load-lock chamber 28, a methane gas plasma is produced by applying a HF voltage to the lower electrode 21 by a HF power source 22 to deposit a carbon film over the surface of the workpiece 8 by a plasma CVD process.

The thickness of the carbon film thus formed in on the order of several hundreds angstroms. After the carbon film of a desired thickness has been formed, the valves 35 and 37 are closed to stop supplying methane gas into the load-lock chamber 28. Subsequently, a gate valve 20 is opened to transfer the workplace holder 9 holding the workpiece 8 from lower electrode 21 disposed in the load-lock chamber 28 to a stage 10 disposed in a processing chamber 18.

Then, similarly to the pattern forming method using the charged particle beam processing system in the first embodiment, the pattern forming method irradiates desired positions and desired regions in the surface of the workpiece 8 with an ion beam 2 while $Cl_2$ gas supplied from a gas cylinder 17 is being blown against the surface of the workpiece 8 to form a desired pattern on the surface of the workpiece 8.

After all the processes for forming the pattern have been completed, the workpiece holder 9 holding the workpiece 8 is returned through the gate valve 20 onto the lower electrode 21 in the load-lock chamber 28. Then, the gate valve 20 is closed, the load-lock chamber 28 is evacuated to a vacuum on the order of $1 \times 10^{-4}$ Pa by an evacuating device, not shown, valves 24 and 26 are opened to supply oxygen gas at a flow rate on the order of several tens standard cubic centimeters per minute regulated by a flow regulator 25 from the gas cylinder 27 into the load-lock chamber 28.

Subsequently, a HF voltage is applied to the lower electrode 21 by a HF power source 22 to produce an oxygen gas plasma in the space between the workpiece holder 9 and an upper electrode 23 connected to a ground to remove the carbon film from the surface of the workpiece 8 by a plasma ashing process. Since $Cl_2$ gas adheres to the carbon film, $Cl_2$ gas is removed together with the carbon film from the workpiece 8.

Consequently, the workpiece 8 will not be corroded by the reaction of $Cl_2$ gas with moisture contained in the atmosphere when the workpiece 8 is taken out from the load-lock chamber 28 into the atmosphere. Although the fourth embodiment uses methane gas for forming the carbon film, a hydrocarbon gas other than methane gas, such as ethane gas, may be used instead of methane gas.

Fifth Embodiment

A charged particle beam processing system in a fifth embodiment according to the present invention and a pattern forming method to be carried out by the same charged particle beam processing system will be described with reference to FIG. 5.

(1) Charged Particle Beam Processing System

Figure 5:
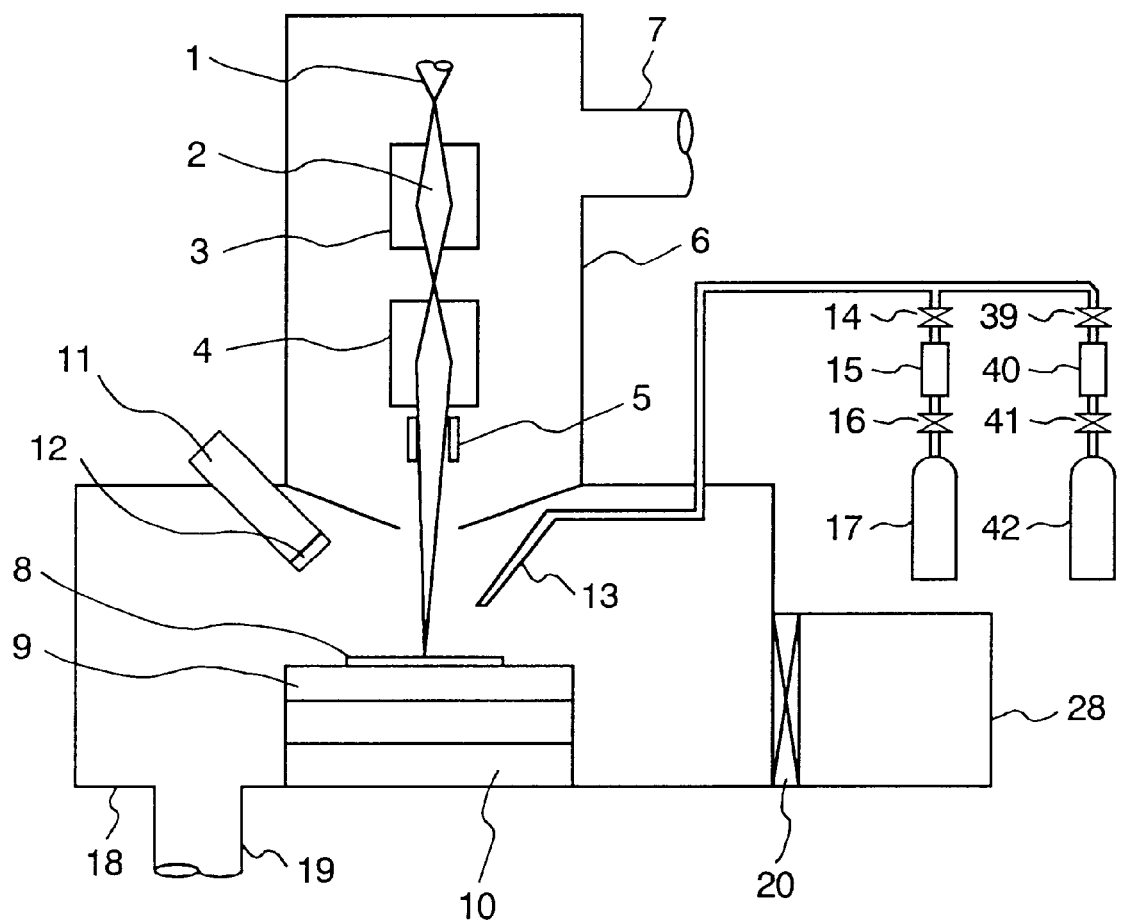
FIG. 5 is a schematic sectional view of a charged particle beam processing system in a fifth embodiment according to the present invention.

As shown in FIG. 5, a reactive gas cylinder 17 containing a reactive gas and a oxygen gas cylinder 42 containing oxygen gas are connected to a gas nozzle 13 disposed in a processing chamber 18. The reactive gas supplied through valves 14 and 16 and a flow regulator 15 to the gas nozzle 13 and the oxygen gas supplied through valves 39 and 41 and a flow regulator 40 to the gas nozzle 13 are blown against a workpiece 8. The charged particle beam processing system in the fifth embodiment is the same in other respects as that in the first embodiment.

(2) Pattern Forming Method Using the Charged Particle Beam Processing System

A workpiece holder 9 holding the workpiece 8 is transferred from a load-lock chamber 28 onto a stage 10 disposed in a processing chamber 10. Desired positions and desired regions in the surface of the workpiece is irradiated with an ion beam 2 while $Cl_2$ gas, i.e., the reactive gas, is being blown against the surface of the workpiece to form a desired pattern by a reactive processing.

Then, the valves 14 and 16 are closed to stop supplying $Cl_2$ gas, and then the valves 39 and 41 are opened to blow oxygen gas supplied at a flow rate on the order of several standard cubic centimeters per minute regulated by the flow regulator 40 against regions in the surface of the workpiece 8 around the regions of the same processed by reactive processing, and then the ion beam 2 is deflected by a deflector 5 for scanning.

The regions in the surface of the workpiece 8 against which $Cl_2$ gas was blown must be scanned with the ion beam 2. $Cl_2$ gas blown through the gas nozzle 13 against the surface of the workpiece 8 spreads in areas of widths in the range of 2 to 3 mm around lines forming the pattern and it is difficult to irradiate those areas with the ion beam 2 by a single irradiation cycle. Therefore, the irradiation cycle is repeated several times to irradiate all the areas in the surface of the workpiece 8 necessary to be irradiated with the ion beam 2 or the stage 10 is moved properly while the ion beam 2 is moved along the lines forming the pattern. When the surface of the workpiece 8 is thus irradiated with the ion beam 2 in the environment of oxygen gas, $Cl_2$ gas adhering to the surface of the workpiece 8 is forced to separate from the surface of the workpiece 8 by the agency of oxygen gas and the energy of the ion beam 2. Consequently, the workpiece 8 will not be corroded by the reaction of $Cl_2$ gas with moisture contained in the atmosphere when the workpiece 8 is taken out from the load-lock chamber 28 into the atmosphere.

The charged particle beam processing system in the fifth embodiment can be constructed simply by providing the processing chamber of a conventional charged particle beam processing system with an oxygen gas supply means for supplying oxygen gas into the processing chamber, and an oxygen gas blowing means for blowing oxygen gas against the surface of a workpiece placed in the processing chamber.

As is apparent from the foregoing description, the charged particle beam processing system in accordance with the present invention and the pattern forming method using the same charged particle beam processing system irradiate the surface of a workpiece with a charged particle beam in an environment of a reactive gas to form a pattern by locally processing portions of the surface of the workpiece irradiated with the charged particle beam by reactive processing. Even if a highly corrosive reactive gas is used to form the pattern by etching a metal thin film formed over the surface of the workpiece at a high etching rate, the workpiece will not be corroded by the reaction of the reactive gas, which may otherwise be remaining on the surface of the workpiece, and moisture contained in the atmosphere when the workpiece is taken out from the charged particle beam processing system into the atmosphere.

What is claimed is:

1. A pattern forming method using a charged particle beam process comprising irradiating a workpiece with a focused charged particle beam in an environment of a reactive gas for the local reactive processing of portions of the workpiece irradiated with the focused charged particle beam to form a pattern, wherein the reactive gas adsorbed by and adhering to a surface of the workpiece is removed from the surface of the workpiece after the pattern has been formed by a reactive gas removing process before taking out the workpiece into the atmosphere, wherein the reactive gas removing process is a sputtering process using an inert gas plasma.

2. A pattern forming method using a charged particle beam process comprising irradiating a workpiece with a focused charged particle beam in an environment of a reactive gas for the local reactive processing of portions of the workpiece irradiated with the focused charged particle beam to form a pattern, wherein the reactive gas adsorbed by and adhering to a surface of the workpiece is removed from the surface of the workpiece after the pattern has been formed by a reactive gas removing process before taking out the workpiece into the atmosphere, wherein the reactive gas removing process includes a step of forming a carbon film on the surface of the workpiece before the reactive processing of the surface of the workpiece using the reactive gas and the focused charged particle beam, and a step of removing the carbon film after the reactive processing of the surface of the workpiece so that the reactive gas adsorbed by and adhering to the surface of the workpiece is removed together with the carbon film.

3. A charged particle beam processing system comprising, as principal components:

an ion beam chamber provided with a charge particle beam source which emits a charged particle beam, and a focusing optical system for focusing the charged particle beam;

a processing chamber provided with a gas nozzle through which a reactive gas is blown against a workpiece, the reactive gas being adsorbed and adhering to a surface of the workpiece and effecting corrosion of the workpiece when the workpiece is exposed to the atmosphere, a secondary particle detector, a workpiece holder for holding the workpiece, and a stage for supporting the workpiece holder holding the workpiece; and a load-lock chamber connected through a gate valve to the processing chamber;

wherein at least the processing chamber or the load-lock chamber is provided with a reactive gas removing means for removing the reactive gas adsorbed by and adhering to the surface of the workpiece from the surface of the workpiece prior to exposing the workpiece to the atmosphere; and wherein the reactive gas removing means comprises an inert gas supply means for supplying an inert gas into the load-lock chamber connected to the processing chamber, and a plasma producing means for producing a plasma in the load-lock chamber, and the reactive gas adhering to the surface of the workpiece is removed from the surface of the workpiece by a sputtering action of an insert gas plasma produced by the plasma processing means.

4. The charged particle beam processing system according to claim 3, wherein the plasma producing means is a high-frequency discharging means or a microwave discharging means.

5. A charged particle beam processing system comprising, as principal components:

an ion beam chamber provided with a charge particle beam source which emits a charged particle beam, and a focusing optical system for focusing the charred particle beam;

a processing chamber provided with a gas nozzle through which a reactive gas is blown against a workpiece, the reactive gas being adsorbed and adhering to a surface of the workpiece and effecting corrosion of the workpiece when the workpiece is exposed to the atmosphere, a secondary particle detector, a workpiece holder for holding the workpiece, and a stage for supporting the workpiece holder holding the workpiece; and a load-lock chamber connected through a gate valve to the processing chamber;

wherein at least the processing chamber or the load-lock chamber is provided with a reactive gas removing means for removing the reactive gas adsorbed by and adhering to the surface of the workpiece from the surface of the workpiece prior to exposing the workpiece to the atmosphere; and wherein an irradiating means for irradiating the workpiece with light emitted by a lamp to heat the workpiece by light emitted by the lamp is disposed within the load-lock chamber, the lamp being one of a mercury vapor lamp and an infrared lamp and the reactive gas adsorbed by and adhering to the surface of the workpiece is removed by heating the workpiece.

6. A charged particle beam processing system comprising, as principal components:

an ion beam chamber provided with a charge particle beam source which emits a charged particle beam, and a focusing optical system for focusing the charged particle beam;

a processing chamber provided with a gas nozzle through which a reactive gas is blown against a workpiece, the reactive gas being adsorbed and adhering to a surface of the workpiece and effecting corrosion of the workpiece when the workpiece is exposed to the atmosphere, a secondary particle detector, a workpiece holder for holding the workpiece, and a stage for supporting the workpiece holder holding the workpiece; and a load-lock chamber connected through a gate valve to the processing chamber;

wherein at least the processing chamber or the load-lock chamber is provided with a reactive gas removing means for removing the reactive gas adsorbed by and adhering to the surface of the workpiece from the surface of the workpiece prior to exposing the workpiece to the atmosphere; and wherein the reactive gas removing means for removing the reactive gas adsorbed by and adhering to the surface of the workpiece during a pattern forming process is disposed within the processing chamber.

7. A charged particle beam processing system comprising, as principal components:

an ion beam chamber provided with a charge particle beam source which emits a charged particle beam, and a focusing optical system for focusing the charged particle beam;

a processing chamber provided with a gas nozzle through which a reactive gas is blown against a workpiece, the reactive gas being adsorbed and adhering to a surface of the workpiece and effecting corrosion of the workpiece when the workpiece is exposed to the atmosphere, a secondary particle detector, a workpiece holder for holding the workpiece, and a stage for supporting the workpiece holder holding the workpiece; and a load-lock chamber connected through a gate valve to the processing chamber;

wherein at least the processing chamber or the load-lock chamber is provided with a reactive gas removing means for removing the reactive gas adsorbed by and adhering to the surface of the workpiece from the surface of the workpiece prior to exposing the workpiece to the atmosphere; and wherein the reactive gas removing means for removing the reactive gas adsorbed by and adhering to the surface of the workpiece during a pattern forming process is disposed within the load-lock chamber connected to the processing chamber, the reactive gas removing means comprises: a plasma producing means including a high-frequency electrode and a high-frequency power source; a hydrocarbon gas supply means for supplying a hydrocarbon gas to form a carbon film on the surface of the workpiece by a CVD process; and a carbon film removing means for removing the carbon film by an oxygen gas plasma ashing process; the carbon film is formed on the surface of the workpiece by the CVD process before pattern formation, and the carbon film is removed together with the reactive gas adsorbed by and adhering to the surface of the workpiece by the oxygen plasma ashing process after the completion of reactive processing using the reactive gas and the charged particle beam.

* * * * *